United States Patent [19]

Coldren et al.

[11] 4,439,268
[45] Mar. 27, 1984

[54] ORIENTATION OF INP SUBSTRATE WAFERS

[75] Inventors: Larry A. Coldren, Holmdel; Lawrence W. Stulz, Shark River Hills, both of N.J.

[73] Assignee: Bell Telephone Laboratories, Incorporated, Murray Hill, N.J.

[21] Appl. No.: 529,286

[22] Filed: Sep. 6, 1983

[51] Int. Cl.³ .................... H01L 21/306; B44C 1/22; C03C 15/00; C03C 25/06
[52] U.S. Cl. ................................. 156/626; 156/647
[58] Field of Search ............... 156/626, 647–649, 156/662; 252/79.2

[56] References Cited

PUBLICATIONS

Journal of the Electrochemi-al Society: Solid-State Science and Technology, vol. 129(2), "New Dislocation Etchant for InP", by S. N. G. Chu et al., pp. 352–354.
J. Electrochem, Soc.: Solid-State Science and Technology, May 1982, "Chemical Etching of InGaAsP/InP DH Wafer" by S. Adachi et al., pp. 1053–1062.
Journal of Materials Science, vol. 8 (1973), "Chemical Etching of {111} and {100} Surfaces of InP", by B. Tuck et al., pp. 1559–1566.
Journal of Crystal Growth, vol. 58 (1982) "LPE Growth on Structured {100} InP Substrates and Their Fabrication by Preferential Etching", by S. E. H. Turley et al., pp. 409–416.
IEEE Journal of Quantum Electronics, vol. QE–18(1), Jan. 1982, "Chemically Etched-Mirror GaInAsP/InP Lasers-Review", by K. Iga et al., pp. 22–29.
J. Electrochem. Soc.: Solid-State Science and Technology, Jun. 1981, "Chemically Etching Characteristics of (001)InP", by S. Adachi et al., pp. 1342–1349.
IEEE Journal of Quantum Electronics, vol. QE-18(10), Oct. 1982, "Etched Mirror and Groove-Coupled GaInAsP/InP Laser Devices for Integrated Optics", by L. A. Coldren et al., pp. 1679–1688.
Journal of Crystal Growth, vol. 29 (1975), "Revelation Metallographique Des Defauts Cristallins Dans InP", by A. Huber et al., pp. 80–84.
Japanese Journal of Applied Physics, vol. 19(1), Jan. 1980, "Chemical Etching of InP and GaInAsP for Fabricating Laser Diodes and Integrated Optical Circuits", by T. Kambaysh et al., pp. 79–85.
IEEE Journal of Quantum Electronics, vol. QE-16(10), Oct., 1980, "GaInAsP/InP DH Lasers with a Chemically Etched Facet", by K. Iga et al., pp. 80–83.

*Primary Examiner*—William A. Powell
*Attorney, Agent, or Firm*—Gregory C. Ranieri

[57] ABSTRACT

A method for determining crystallographic orientation of an InP substrate wafer includes the steps of immersing at least a portion of the substrate wafer in a chemical etchant for a predetermined amount of time to expose features having a predetermined shape and designating a particular crystallographic direction on the substrate wafer in accordance with relative positions of features on the portion of the substrate wafer.

9 Claims, 2 Drawing Figures

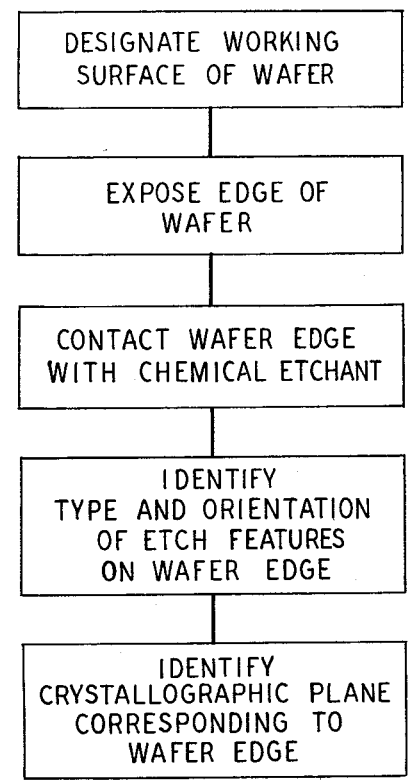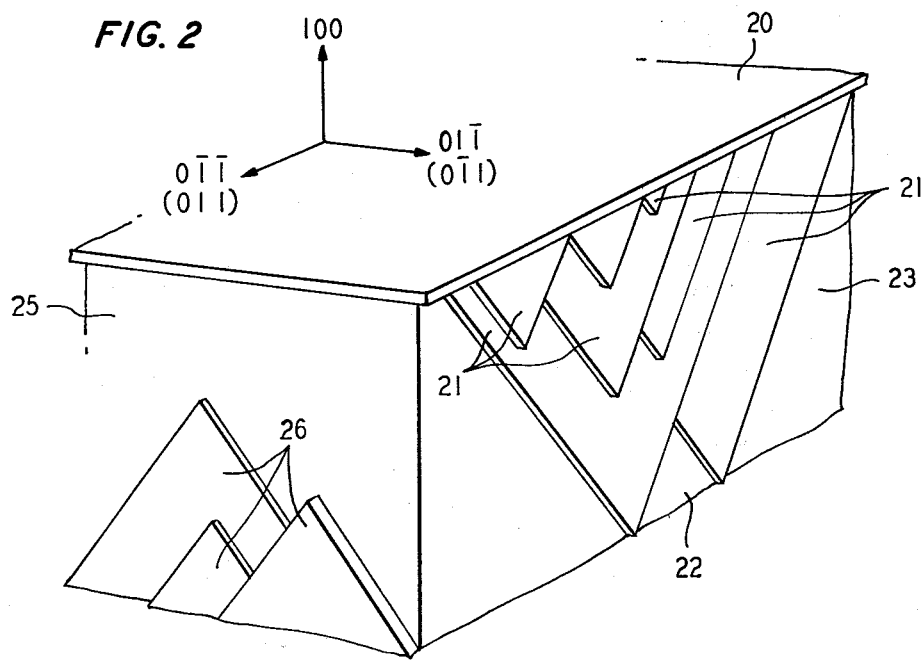

ORIENTATION OF INP SUBSTRATE WAFERS

TECHNICAL FIELD

This invention relates to a method of orienting a wafer of Group III-V semiconductor material.

BACKGROUND OF THE INVENTION

Optical, electronic and optoelectronic devices are currently being developed using Group III-V semiconductor materials. In particular, many of these devices are being developed on InP or InP-substrate based systems. Long wavelength, index guided, injection lasers are one example of devices formed on an InP substrate.

Fabrication techniques for making these devices including the index guided, injection lasers depend upon a knowledge of the substrate wafer orientation prior to such processing steps as photolithographic masking or etching, for example. In the case of the index guided laser, it is necessary to obtain the substrate wafer orientation in order to form either the mesa or channel which defines the optical waveguide of the laser.

Various techniques have been used to orient substrate wafers. In general, the prior techniques have incorporated a processing step which causes at least partial destruction of the working surface, i.e., the (100) surface, by either etching or masking. For example, T. Kambayashi et al. in *Jap. J. of Appl. Phys.*, Vol. 19, No. 1, pp. 79–85 (1980), show an orientation technique wherein the working surface of a Group III-V semiconductor material substrate is chemically etched to produce geometrically definable etch pits such as long, narrow grooves or ellipsoids or the like at the sites of dislocations, defects or other imperfections in the surface of the crystalline structure. The etch pits are then examined to determine the relative orientation of an axis of each etch pit. One drawback of this technique is the requirement that the defects or imperfections exist in the crystalline structure so that the desired etch pits are produced when the material is chemically etched. Another exemplary orientation technique is shown by K. Iga et al. in *IEEE J. of Quantum Electronics*, Vol. QE-16, No. 10, pp. 1044–1047 (1980). In this technique, the working surface of the material is photo-lithographically masked with a cross-hatched pattern. Subsequently, unmasked portions of the working surface are contacted by a chemical etchant to reveal different sidewall geometries in the etch pits so made. The material is cleaved through the cross-hatched pattern in order to reveal different cross-sectional views on the $(01\bar{1})$ and (011) surfaces. Inspection of the sidewall geometries allows one to identify the (011) or $(01\bar{1})$ surfaces. However, this technique suffers from the drawback that photolithographic masking must be performed on the working surface of the material in order to orient the crystal. Furthermore, a portion of the working surface is destroyed in orienting the material.

SUMMARY OF THE INVENTION

Orientation of a substrate wafer is performed simply and through nondestructive means, in accordance with the principles of the present invention, contacting at least a first edge surface with a chemical etchant to expose features having a predetermined shape on the at least first edge surface, and designating a particular crystallographic direction on the substrate wafer in accordance with the orientation of the features on the first edge surface.

BRIEF DESCRIPTION OF THE DRAWINGS

A more complete understanding of the invention may be obtained by reading the following description of a specific illustrative embodiment of the invention in conjunction with the appended drawing in which:

FIG. 1 is a flowchart of the steps in the method of crystallographic orientation for a substrate wafer and FIG. 2 shows an InP substrate wafer after etching in a solution of HCl.

DETAILED DESCRIPTION

Generally, during device fabrication on a (100) InP substrate wafer, the wafer is subjected to a photolithographic masking technique which requires proper alignment of the mask on the (100) surface. Proper alignment is required because (100) InP wafers etches anisotropically in HCl, for example, to expose only the $(01\bar{1})$ and $(01\bar{1})$ crystal planes which are perpendicular to the (100) surface. Two other crystal planes, namely the (011) and $(01\bar{1})$ planes which are perpendicular to the (100) surface and the $(01\bar{1})$ planes, are not exposed by etching in HCl. Hence, when it is necessary to expose surfaces perpendicular to the (100) surface, the (100) substrate wafer must be properly oriented so that etching of the masked wafer will produce the desired result.

FIG. 1 illustrates method steps designed in accordance with the principles of this invention which produce proper orientation of a (100) InP substrate wafer. According to this method, it is possible to distinguish the $(01\bar{1})$ and $(01\bar{1})$ planes from the (011) and $(01\bar{1})$ planes without destroying or processing large portions of the substrate wafer.

The first step calls for designation of a working surface of the wafer. The working surface is also called the (100) surface. Designation of this surface is arbitrary. However, the working surface is usually specified by previous processing steps, such as polishing or epitaxial layer growth, although this is not necessary.

Following the designation of the working surface, at least one edge of the substrate wafer is exposed. This is accomplished by cleaving or cracking the substrate wafer to remove scrap portions of the wafer. The edge or edges exposed in this step are perpendicular to the working (100) surface. These edges correspond to at least one of the following cleavage planes: (011), $(01\bar{1})$, $(01\bar{1})$, or $(01\bar{1})$. It is desirable to expose two edges perpendicular to each other such as (011) and $(01\bar{1})$, for example, for purposes of identification and comparison in later steps.

Contacting the exposed edge or edges of the substrate wafer with a chemical etchant is the next step of the method. Preferential, anisotropic etchants such as a solution of HCl or the like are preferred chemical etchants. Etching is performed for a sufficient period of time to create features on the wafer edge having a predetermined shape as the triangular protrusions and indentations shown in FIG. 2. In an example, a (100) InP substrate wafer is etched in concentrated HCl (greater than 25% HCl concentration in aqueous solution) at 20 degrees Centigrade for 20 seconds to produce features resembling those shown in FIG. 2. Longer etching times, for example, several minutes, at this concentration and temperature enhance the depth or height of the triangular features. It is to be understood that variations in temperature, exposure time to etchant, and concentration of etchant affect the size of the features.

The next step of the method is to identify the type and orientation of the etched features on each exposed edge of the substrate wafer. Etch features exposed by HCl on the {011} edge surfaces of the (100) InP substrate wafer are substantially triangular and either protrude from or are indented in each edge. It is important to determine whether the type of feature is an indentation or a protrusion and, then, whether the feature is oriented up toward the working surface of down away from the working surface.

Determination of whether a feature is a protrusion or an indentation is sometimes difficult. This difficulty can be alleviated by observing the features through a stereoscopic microscope. Alternatively, the features may be observed through a standard microscope using a shallow depth of field and adjusting the focus at an edge of the feature.

The final step of the method is to identify the crystallographic plane corresponding to each exposed substrate wafer edge. It has been determined that triangular protrusions point down, that is, away from the working surface, on the $(01\bar{1})$ and (011) surfaces. Triangular indentations are oriented in the opposite direction in that they point up on these same surfaces, $(01\bar{1})$ and $(01\bar{1})$. On the other hand, triangular protrusions point up toward the working surface on the $(01\bar{1})$ and $(0\bar{1}1)$ surfaces. On these latter surfaces, the triangular indentations point down away from the working surface.

After an edge surface containing the triangular features is identified as a crystallographic plane, a crystallographic direction is designated on the substrate wafer. For example, the direction normal to the edge surface can be designated for the substrate wafer.

The method described in conjunction with FIG. 1 permits relative identification of the stop etch planes, the $(01\bar{1})$ and $(01\bar{1})$ surfaces, perpendicular to the (100) working surface. For example, the method results in a relative identification of an edge as one of two parallel planes such as the $(01\bar{1})$ and $(0\bar{1}1)$ planes or the $(01\bar{1})$ planes. There is no chemical difference between the $(01\bar{1})$ and $(0\bar{1}1)$ planes because of the symmetry of the crystal. Similarly, there is no chemical difference between the $(01\bar{1})$ and (011) planes. Thus in practice, only this relative identification is necessary for complete orientation of the substrate wafer because the method identifies each edge as a surface having either a {111}A or {111}B plane intersecting the particular edge normal and the normal to the working surface. The location of one or the other of the polar generic {111} planes is important to know when etching (100) InP because the {111}A planes are more difficult to etch than the {111}B planes.

FIG. 2 shows a portion of the (100) InP substrate wafer after etching in a solution of HCl in the contacting step of the method. Because the orientation is relative, a reference coordinate system is shown along with an alternative reference coordinate system which is included in parentheses.

In FIG. 2, surface 20 of the (100) InP substrate wafer is the working surface. Surface 20 is usually identified as the working surface because it is polished or has photolithographic mask films or epitaxial layers thereon. Protrusions 21 point away from working surface 20 on edge 23. Indentation 22 points up toward working surface 20 on edge 23. Triangular protrusions 26 point up toward working surface 20 on edge 25. In accordance with the principles of the present invention, the substrate wafer is oriented with surface 23 as the $(01\bar{1})$ plane (or $(0\bar{1}1)$ plane) and with surface 25 as the $(01\bar{1})$ plane (or (011) plane).

What is claimed is:

1. A method of determining the orientation of a (100) InP substrate wafer, the method comprising the steps of
    contacting at least a portion of the substrate wafer with a chemical etchant to expose a plurality of features having a predetermined shape on the portion of substrate wafer, and
    designating a crystallographic direction on the substrate wafer in accordance with the orientation of the features on the portion of the substrate wafer, the method being characterized in that the portion of the substrate wafer includes at least one surface being substantially perpendicular to the (100) plane.

2. The method as defined in claim 1 wherein the at least one surface is a cleavage plane.

3. The method as defined in claim 1 wherein the chemical etchant is a preferential etchant.

4. The method as defined in claim 2 wherein the chemical etchant is concentrated HCl.

5. The method as defined in claim 3 wherein the predetermined shape of the feature is triangular.

6. A method of determining the orientation of a (100) InP substrate wafer, the method characterized by the steps of
    cleaving at least a first surface substantially perpendicular to the (100) plane,
    contacting at least the first surface of the substrate wafer with a chemical etchant to expose a plurality of features having a predetermined shape on the portion of substrate wafer, and
    designating a crystallographic direction on the substrate wafer in accordance with the orientation of the features on the first surface of the substrate wafer.

7. The method as defined in claim 6 wherein the chemical etchant is a preferential etchant.

8. The method as defined in claim 7 wherein the chemical etchant is concentrated HCl.

9. The method as defined in claim 8 wherein the predetermined shape of the feature is triangular.

* * * * *

UNITED STATES PATENT AND TRADEMARK OFFICE
CERTIFICATE OF CORRECTION

PATENT NO. : 4,439,268

DATED : March 27, 1984

INVENTOR(S) : Larry A. Coldren and Lawrence W. Stulz

It is certified that error appears in the above-identified patent and that said Letters Patent is hereby corrected as shown below:

In the Detailed Description, Column 2, line 49, "01$\bar{1}$" should read --0$\bar{1}$1--; in Column 2, line 50, "01$\bar{1}$" second occurrence should read --0$\bar{1}$1--; in Column 3, line 24, "01$\bar{1}$" should read --0$\bar{1}$1--, and "0$\bar{1}$1" should read --0$\bar{1}$1--; in Column 3, line 28, "01$\bar{1}$" first occurrence should read --0$\bar{1}$1-- and "01$\bar{1}$" second occurrence should read --0$\bar{1}$1--; in Column 3, line 38, "01$\bar{1}$" should read --0$\bar{1}$1--; in Column 3, line 41, "01$\bar{1}$" second occurrence should read --0$\bar{1}$1--, and "01$\bar{1}$" third occurrence should read --0$\bar{1}$1--; in Column 3, line 43, "01$\bar{1}$" second occurrence should read --0$\bar{1}$1--; in Column 3, line 45, "01$\bar{1}$" should read --0$\bar{1}$1--; in Column 4, line 13, "01$\bar{1}$" should read --0$\bar{1}$1--; in Column 4, line 14, "01$\bar{1}$" should read --0$\bar{1}$1--.

Signed and Sealed this

Twenty-third Day of October 1984

[SEAL]

Attest:

GERALD J. MOSSINGHOFF

Attesting Officer

Commissioner of Patents and Trademarks